United States Patent
Yu et al.

(10) Patent No.: US 7,898,376 B2
(45) Date of Patent: Mar. 1, 2011

(54) TRANSFORMER APPARATUS WITH SHIELDING ARCHITECTURE AND SHIELDING METHOD THEREOF

(75) Inventors: Yuan Yuan Yu, Jiangsu (CN); Li Chung Chen, Taipei (TW)

(73) Assignee: Sercomm Corporation, Taipei (TW)

( * ) Notice: Subject to any disclaimer, the term of this patent is extended or adjusted under 35 U.S.C. 154(b) by 0 days.

(21) Appl. No.: 12/123,873

(22) Filed: May 20, 2008

(65) Prior Publication Data

US 2009/0289755 A1     Nov. 26, 2009

(51) Int. Cl.
*H01F 27/36* (2006.01)
*H01F 27/06* (2006.01)
*H01F 27/28* (2006.01)
*H01F 7/06* (2006.01)

(52) U.S. Cl. ......... 336/84 R; 336/65; 336/182; 336/229; 29/602.1

(58) Field of Classification Search .................. None
See application file for complete search history.

(56) References Cited

U.S. PATENT DOCUMENTS

| | | | | | |
|---|---|---|---|---|---|
| 2,290,680 | A | * | 7/1942 | Franz | 336/20 |
| 2,888,654 | A | * | 5/1959 | Bugg | 336/221 |
| 2,905,912 | A | * | 9/1959 | Geiser | 336/73 |
| 3,143,720 | A | * | 8/1964 | Rogers | 336/155 |
| 3,149,296 | A | * | 9/1964 | Cox | 336/84 R |
| 3,292,127 | A | * | 12/1966 | Dormaier | 336/84 R |
| 3,312,919 | A | * | 4/1967 | Ross | 336/84 R |
| 3,662,257 | A | * | 5/1972 | Fujiwara | 324/207.17 |
| 4,338,951 | A | * | 7/1982 | Saliga | 600/300 |
| 4,727,316 | A | * | 2/1988 | Shen et al. | 324/127 |
| 4,806,895 | A | * | 2/1989 | Petrow | 336/65 |
| 4,975,672 | A | * | 12/1990 | McLyman | 336/198 |
| 5,696,477 | A | * | 12/1997 | Yamamori et al. | 336/192 |
| 5,838,220 | A | * | 11/1998 | Hagberg | 336/206 |
| 6,191,377 | B1 | * | 2/2001 | Roesner et al. | 218/149 |
| 6,380,545 | B1 | * | 4/2002 | Yan | 250/396 ML |
| 2005/0183874 | A1 | * | 8/2005 | Vargas et al. | 174/53 |
| 2006/0028782 | A1 | * | 2/2006 | Polivka et al. | 361/143 |
| 2007/0139149 | A1 | * | 6/2007 | Arai | 336/90 |
| 2008/0157914 | A1 | * | 7/2008 | Pokharna et al. | 336/220 |
| 2008/0302955 | A1 | * | 12/2008 | Dzengeleski et al. | 250/252.1 |

OTHER PUBLICATIONS

Collins cobuild English Dictionary for Advanced Learners; Harper Collins Publishers; Third Edition; p. 1812.

* cited by examiner

*Primary Examiner* — Anh T Mai
*Assistant Examiner* — Mangtin Lian
(74) *Attorney, Agent, or Firm* — WPAT, PC; Justin King

(57) ABSTRACT

A transformer apparatus and a transformer shielding method are provided for shielding external electronic noises and protecting against erosion. The transformer apparatus comprises a toroidal core, a primary winding, a secondary winding, a protection tape, a metal foil, and an UL tube. The primary winding and the secondary winding are wound around the toroidal core at opposite side to each other. The protection tape is wrapped around the primary winding and the secondary winding. The metal foil encloses the protection tape. The UL tube enfolds the metal foil. The transformer shielding method comprises wrapping a primary winding and a secondary winding of the transformer apparatus by a protection tape, enclosing the protection tape by a metal foil, and enfolding the metal foil by an UL tube.

19 Claims, 7 Drawing Sheets

TRANSFORMER APPARATUS WITH SHIELDING ARCHITECTURE AND SHIELDING METHOD THEREOF

BACKGROUND OF THE INVENTION

1. Field of the Invention

The present invention relates in general to a transformer apparatus and a shielding method and, more particularly, to a transformer apparatus with shielding architecture and related shielding method.

2. Description of the Prior Art

Please refer to FIG. 1 and FIG. 2. FIG. 1 is a schematic side view showing the configuration of a conventional transformer apparatus. FIG. 2 is a circuit diagram of the transformer apparatus shown in FIG. 1. The conventional transformer apparatus 100 comprises a toroidal core 105, a primary winding 110, a secondary winding 120, an UL tube 160, an epoxy resin 170, a base 180, and a plurality of lead terminals 111, 112, 121 and 122.

The primary winding 110 having a predetermined number of turns is wound around the toroidal core 105. The primary winding 110 has two lead terminals 111 and 112 to which an AC power source is applied. The secondary winding 120 having another predetermined number of turns is also wound around the toroidal core 105. The secondary winding 120 has two lead terminals 121 and 122 which are connected to a load. The UL tube 160 enfolding the primary winding 110 and the secondary winding 120 is water resistant and offers protection for the primary winding 110 and the secondary winding 120 against water or moisture. The epoxy resin 170 is utilized for mounting the toroidal core 105 onto the base 180.

However, the conventional transformer apparatus 100 is not able to offer protection against external electrical noises, and it is well known that there are noise-generating devices everywhere, which function as noise sources to other peripheral electronic devices. The electrical noises from such noise-generating devices may cause a power line disturbance due to a fluctuating magnetic field in the toroidal core 105 affected by the noise-related electromagnetic interference and have a bad effect on other peripheral electronic devices. Therefore, the electronic devices having voltage sensitive feature may be subject to a software malfunction or a hardware breakdown resulting from the external electrical noises. Accordingly, there is a big need to take measures against electric noises for reliability enhancement and lifetime protection of various electronic devices. That is to say, a noise-shielded transformer apparatus is required to prevent electrical noises generated by a noise-making device from penetrating into other peripheral devices.

For that reason, the present invention provides a transformer apparatus with shielding architecture and related shielding method to solve the aforementioned problems.

SUMMARY OF THE INVENTION

It is therefore a primary objective of the present invention to provide a shielded transformer apparatus for solving the prior art problems.

In accordance with an objective of the present invention, a transformer apparatus having functionalities of shielding external electronic noises and protecting against erosion is provided. The transformer apparatus comprises a toroidal core, a primary winding, a secondary winding, a protection tape, a metal foil, and an UL tube. The primary winding is wound around the toroidal core at one side. The secondary winding is wound around the toroidal core at the other side opposite to the primary winding. The protection tape is wrapped around the primary winding and the secondary winding. The metal foil encloses the protection tape. The UL tube enfolds the metal foil.

The present invention further provides a transformer shielding method for generating a shielded transformer apparatus. The transformer shielding method comprises: winding a primary winding using an insulated wire around a toroidal core at one side, winding a secondary winding using an insulated wire around the toroidal core at the other side opposite to the primary winding, mounting the toroidal core onto a base by an epoxy resin, wrapping the primary winding and the secondary winding by a protection tape, enclosing the protection tape by a metal foil, and enfolding the metal foil by an UL tube.

These and other objectives of the present invention will no doubt become obvious to those of ordinary skill in the art after reading the following detailed description of the preferred embodiments that are illustrated in the various figures and drawings.

BRIEF DESCRIPTION OF THE DRAWINGS

The above and other objects and features of the present invention will become apparent from the subsequent description of preferred embodiments given in conjunction with the following accompanying drawings.

DETAILED DESCRIPTION OF THE PREFERRED EMBODIMENT

Hereinafter, preferred embodiments of the present invention will be described in detail with reference to the accompanying drawings. Here, it is to be noted that the present invention is not limited thereto.

Figure 3:
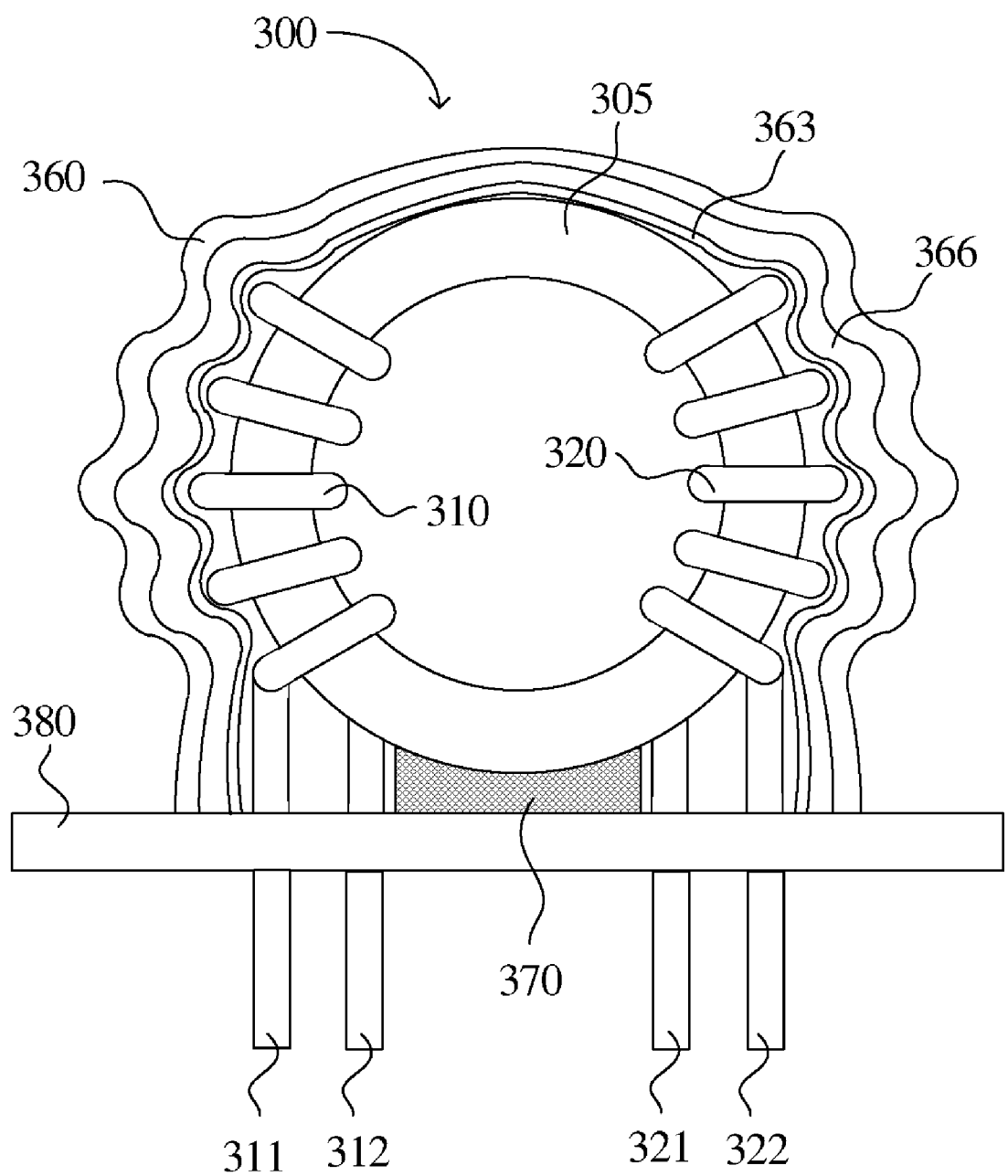
FIG. 3 is a schematic side view showing the configuration of a transformer apparatus in accordance with a first preferred embodiment of the present invention.
Figure 4:
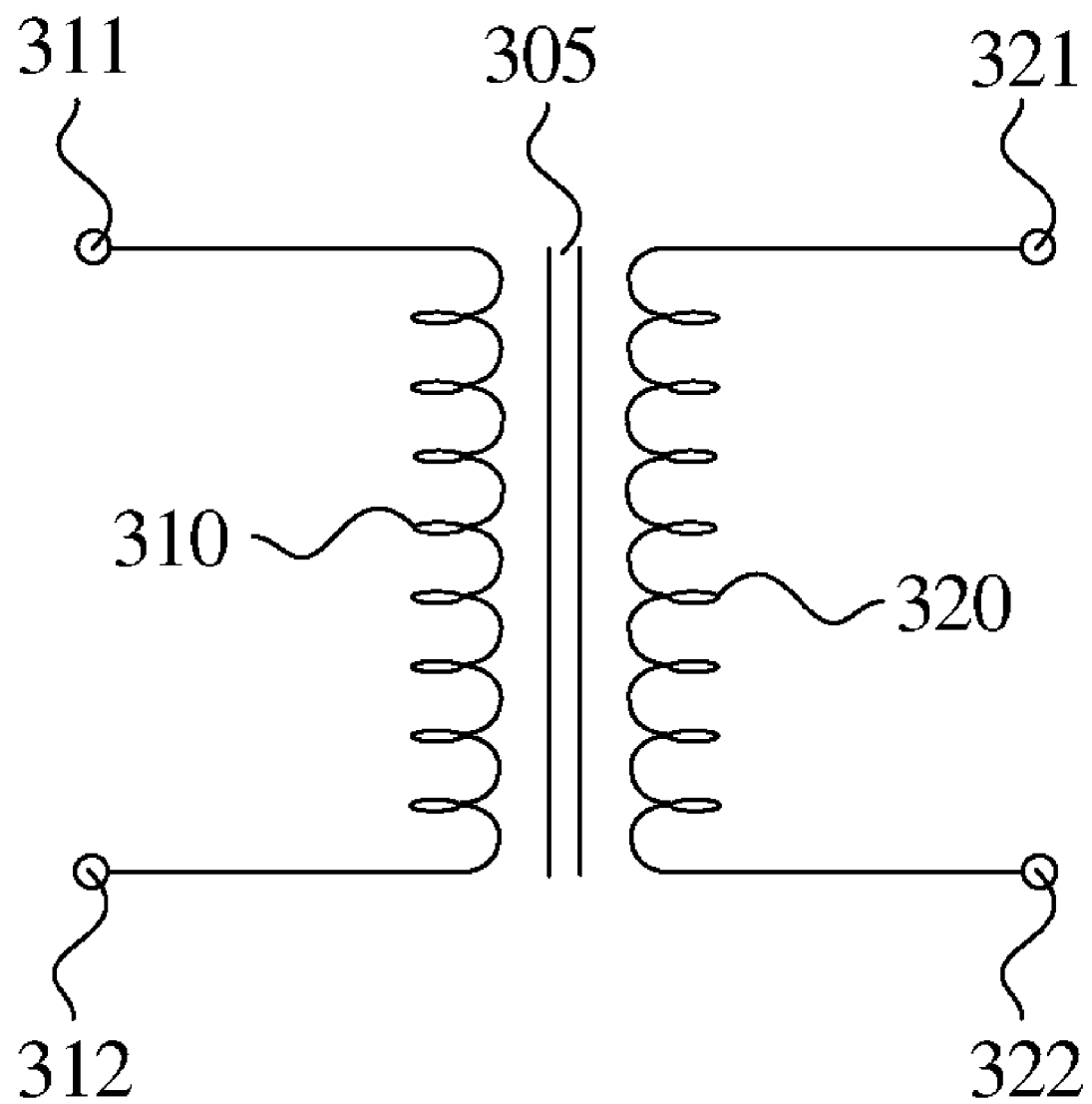
FIG. 4 shows a circuit diagram of the transformer apparatus shown in FIG. 3.

Please refer to FIG. 3 and FIG. 4. FIG. 3 is a schematic side view showing the configuration of a transformer apparatus in accordance with a first preferred embodiment of the present invention. FIG. 4 is a circuit diagram of the transformer apparatus shown in FIG. 3. The transformer apparatus 300 comprises a toroidal core 305, a primary winding 310, a secondary winding 320, a protection tape 363, a metal foil 366, an UL tube 360, an epoxy resin 370, a base 380, and a plurality of lead terminals 311, 312, 321 and 322. The epoxy resin 370 is utilized for mounting the toroidal core 305 onto the base 380.

The primary winding 310 having a predetermined number of turns is wound around the toroidal core 305 at one side. The primary winding 310 has two lead terminals 311 and 312 to which an AC power source (not shown) is applied. The secondary winding 320 having another predetermined number of turns is wound around the toroidal core 305 at the other side opposite to the primary winding 310. The secondary winding 320 has two lead terminals 321 and 322 which are connected to a load (not shown).

The wires of the primary winding 310 and the secondary winding 320 can be oleoreslnous enameled wires, synthetic enameled wires, polyurethane enameled wires, polyester enameled wires, polyester-imide enameled wires, nylon coated polyurethane enameled wires, or tinnable polyester enameled wires. Alternatively, the wires of the primary winding 310 and the secondary winding 320 can be triple-insulation wires having triple-layer insulation covering which offer extra protection against pinholes and reinforce tolerance for temperature. The functionalities of the toroidal core 305, the primary winding 310, and the secondary winding 320 are well known to those skilled in the art and, for the sake of brevity, further discussion is omitted.

The protection tape 363 is an insulation tape and is wrapped around the toroidal core 305 together with the primary winding 310 and the secondary winding 320 in the manner shown in FIG. 3 for protecting the primary winding 310 and the secondary winding 320 against erosion. It is noteworthy to point out that the protection tape 363 substantially encloses the primary winding 310 and the secondary winding 320 although the schematic diagram of FIG. 3 is not convenient to clearly demonstrate the protection architecture. The protection tape 363 can be a polyethylene tape. The metal foil 366 is used to enclose the protection tape 363 in the manner shown in FIG. 3 so that external electrical noises such as electromagnetic waves cannot penetrate to affect the operations of the toroidal core 305, the primary winding 310 and the secondary winding 320. The metal foil 366 can be a copper foil, an aluminum foil, or a tin foil. The UL tube 360 enfolding metal foil 366 is water resistant and offers rudimentary protection against water or moisture, which in turn protects the metal foil 366 against oxidation and corrosion. In accordance with another embodiment of the present invention, the bottom edge of the protection tape 363, the metal foil 366, or the UL tube 360 can be glued to the base 380 by another epoxy resin (not shown) so that the toroidal core 305 together with the primary winding 310 and the secondary winding 320 can be sealed closely within the space enclosed by the protection tape 363, the metal foil 366, or the UL tube 360, and the base 380.

Figure 1:
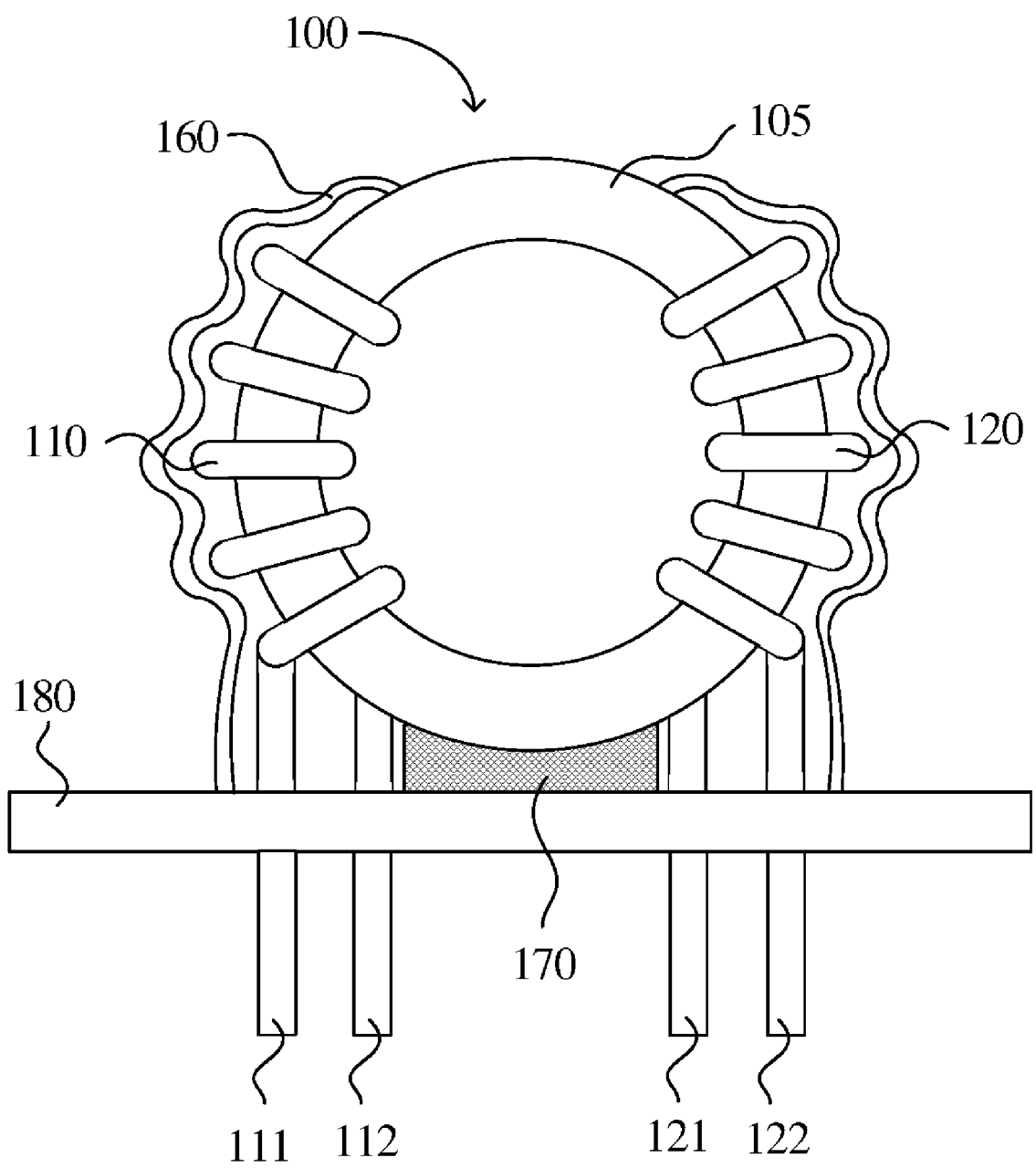
FIG. 1 is a schematic side view showing the configuration of a conventional transformer apparatus.
Figure 2:
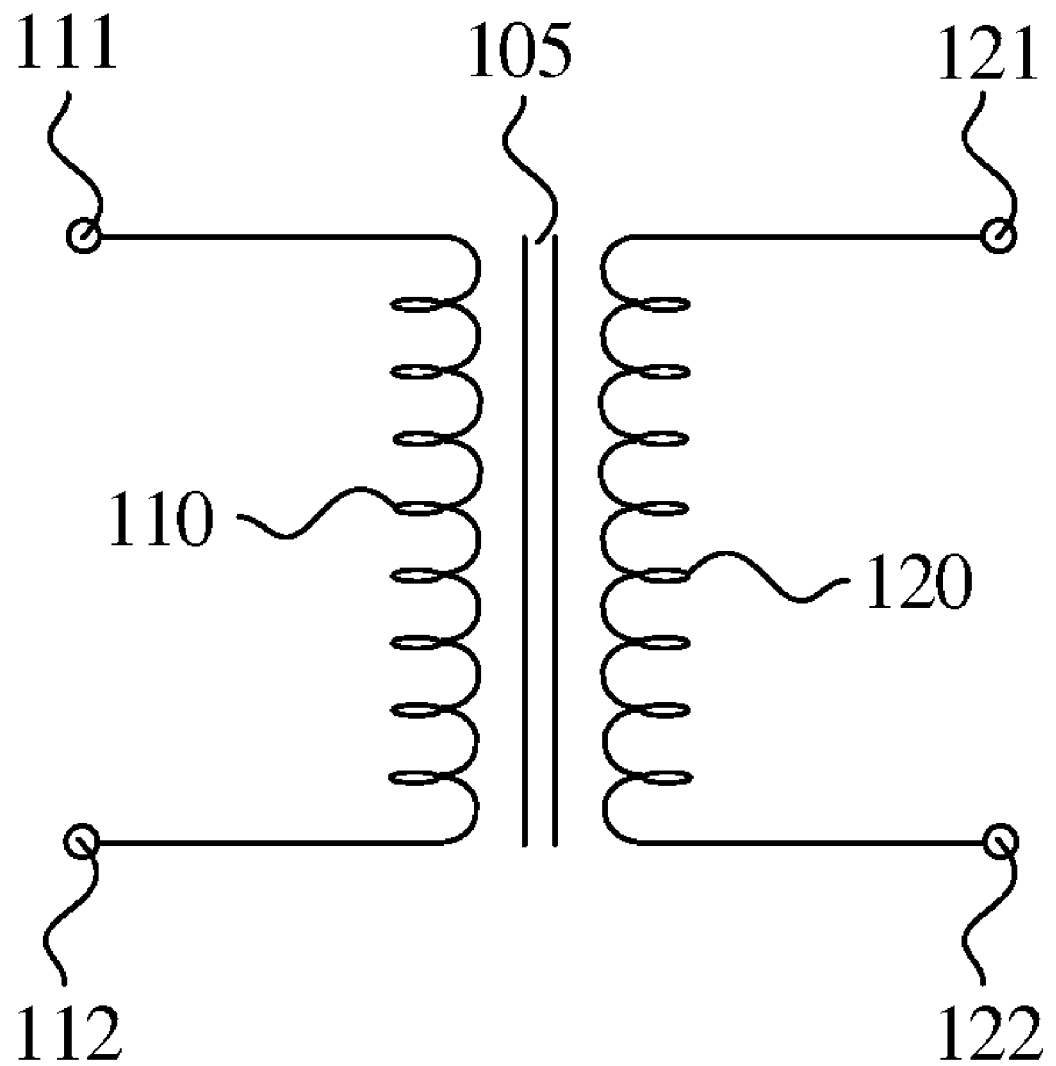
FIG. 2 shows a circuit diagram of the transformer apparatus shown in FIG. 1.

In summary, compared with the conventional transformer apparatus 100 shown in FIG. 1, the transformer apparatus 300 according to the present invention offers two extra protection shields for reinforcing structure of the transformer apparatus and preventing penetration of external electrical noises. Furthermore, the two extra protection shields by the copper foil and the polyethylene tape are actually a cost-effective means for solving the prior art problems.

Figure 5:
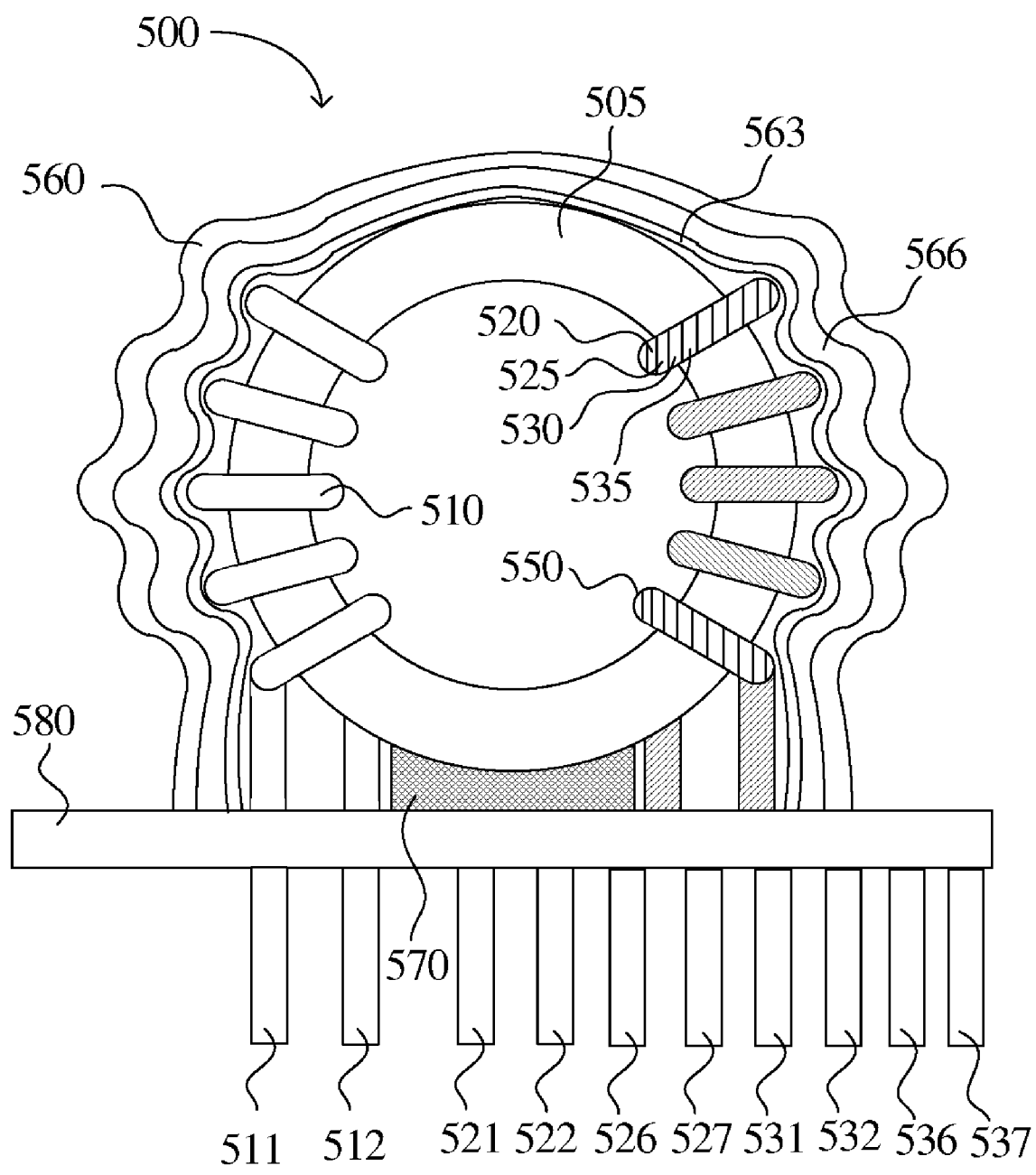
FIG. 5 is a schematic side view showing the configuration of a transformer apparatus in accordance with a second preferred embodiment of the present invention.
Figure 6:
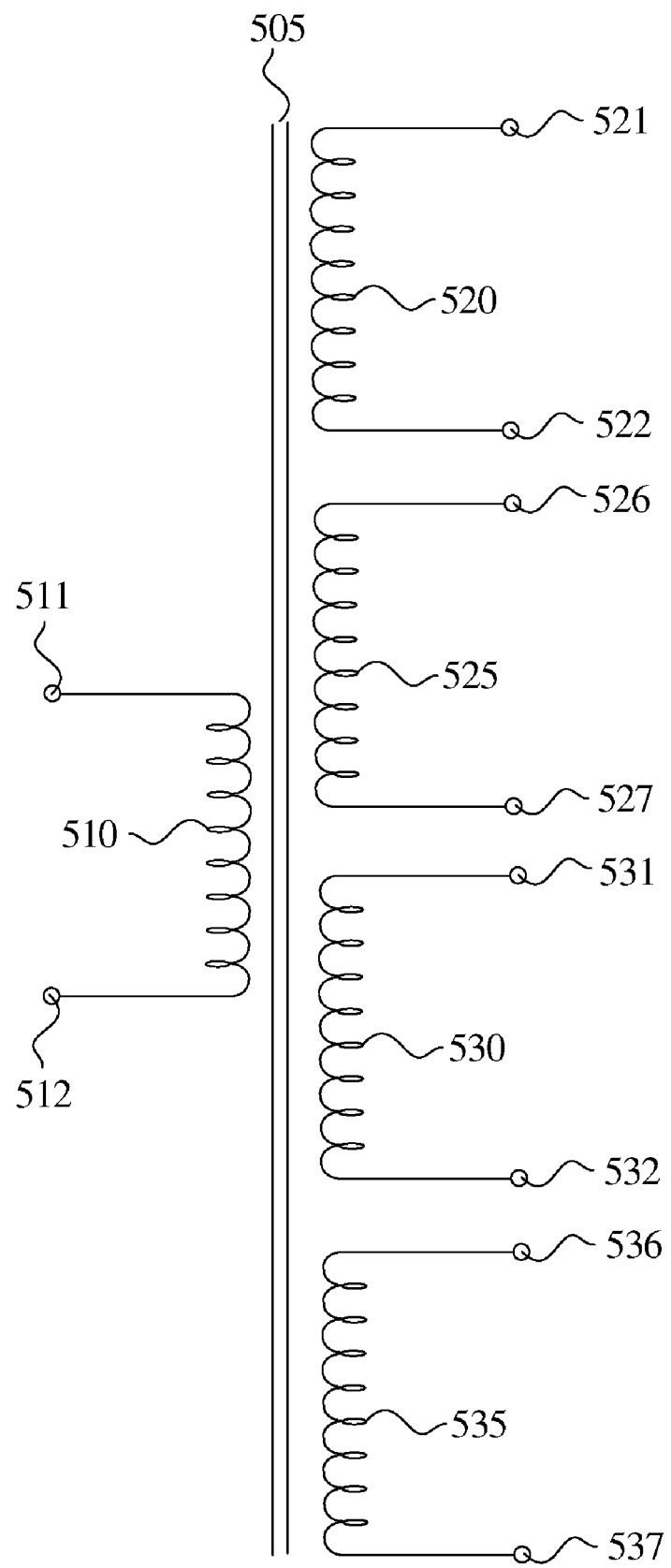
FIG. 6 shows a circuit diagram of the transformer apparatus shown in FIG. 5.

Please refer to FIG. 5 and FIG. 6. FIG. 5 is a schematic side view showing the configuration of a transformer apparatus in accordance with a second preferred embodiment of the present invention. FIG. 6 is a circuit diagram of the transformer apparatus shown in FIG. 5. The transformer apparatus 500 comprises a toroidal core 505, a primary winding 510, a plurality of secondary windings 520, 525, 530 and 535, a protection tape 563, a metal foil 566, an UL tube 560, an epoxy resin 570, a base 580, and a plurality of lead terminals 511, 512, 521, 522, 526, 527, 531, 532, 536 and 537. The epoxy resin 570 is utilized for mounting the toroidal core 505 onto the base 580.

Similarly, the primary winding 510 having a predetermined number of turns is wound around the toroidal core 505 at one side. The primary winding 510 has two lead terminals 511 and 512 to which an AC power source is applied. The plurality of secondary windings 520, 525, 530 and 535 are stranded together to form a winding 550.

The winding 550 having another predetermined number of turns is wound around the toroidal core 505 at the other side opposite to the primary winding 510, which means that the secondary windings 520, 525, 530 and 535 are all having same predetermined number of turns as that of the winding 550. The secondary winding 520 has two lead terminals 521 and 522 which are connected to a first load (not shown). The secondary winding 525 has two lead terminals 526 and 527 which are connected to a second load (not shown). The secondary winding 530 has two lead terminals 531 and 532 which are connected to a third load (not shown). The secondary winding 535 has two lead terminals 536 and 537 which are connected to a fourth load (not shown).

The wires of the primary winding 510, the secondary windings 520, 525, 530 and 535 can be triple-insulation wires, oleoreslnous enameled wires, synthetic enameled wires, polyurethane enameled wires, polyester enameled wires, polyester-imide enameled wires, nylon coated polyurethane enameled wires, or tinnable polyester enameled wires.

The protection tape 563 is an insulation tape and is wrapped around the toroidal core 505 together with the primary winding 510 and the secondary winding 520 in the manner shown in FIG. 5 for protecting the primary winding 510 and the secondary winding 520 against erosion. In a manner similar to that described above, the primary winding 510 and the secondary winding 520 are substantially enclosed by the protection tape 563 although the schematic diagram of FIG. 5 is not convenient to clearly demonstrate the protection architecture. The protection tape 563 can be a polyethylene tape. The metal foil 566 is used to enclose the protection tape 563 in the manner shown in FIG. 5 so that external electrical noises such as electromagnetic waves cannot penetrate to affect the operations of the toroidal core 505, the primary winding 510 and the secondary winding 520. The metal foil 566 can be a copper foil, an aluminum foil, or a tin foil. The UL tube 560 enfolding metal foil 566 is water resistant and offers rudimentary protection against water or moisture, which in turn protects the metal foil 566 against oxidation and corrosion. In accordance with another embodiment of the present invention, the bottom edge of the protection tape 563, the metal foil 566, or the UL tube 560 can be glued to the base 380 by another epoxy resin (not shown) so that the toroidal core 505 together with the primary winding 510 and the secondary windings 520, 525, 530 and 535 can be sealed closely within the space enclosed by the protection tape 563, the metal foil 566, or the UL tube 560, and the base 580.

Again, compared with the conventional transformer apparatus 100 shown in FIG. 1, the transformer apparatus 500 according to the present invention offers two extra protection shields for reinforcing structure of the transformer apparatus and preventing penetration of external electrical noises. Moreover, a plurality of secondary windings stranded together can provide identical and stable induction voltages for a plurality of loads. Furthermore, the two extra protection shields by the copper foil and the polyethylene tape are actually a cost-effective means for solving the prior art problems.

Figure 7:
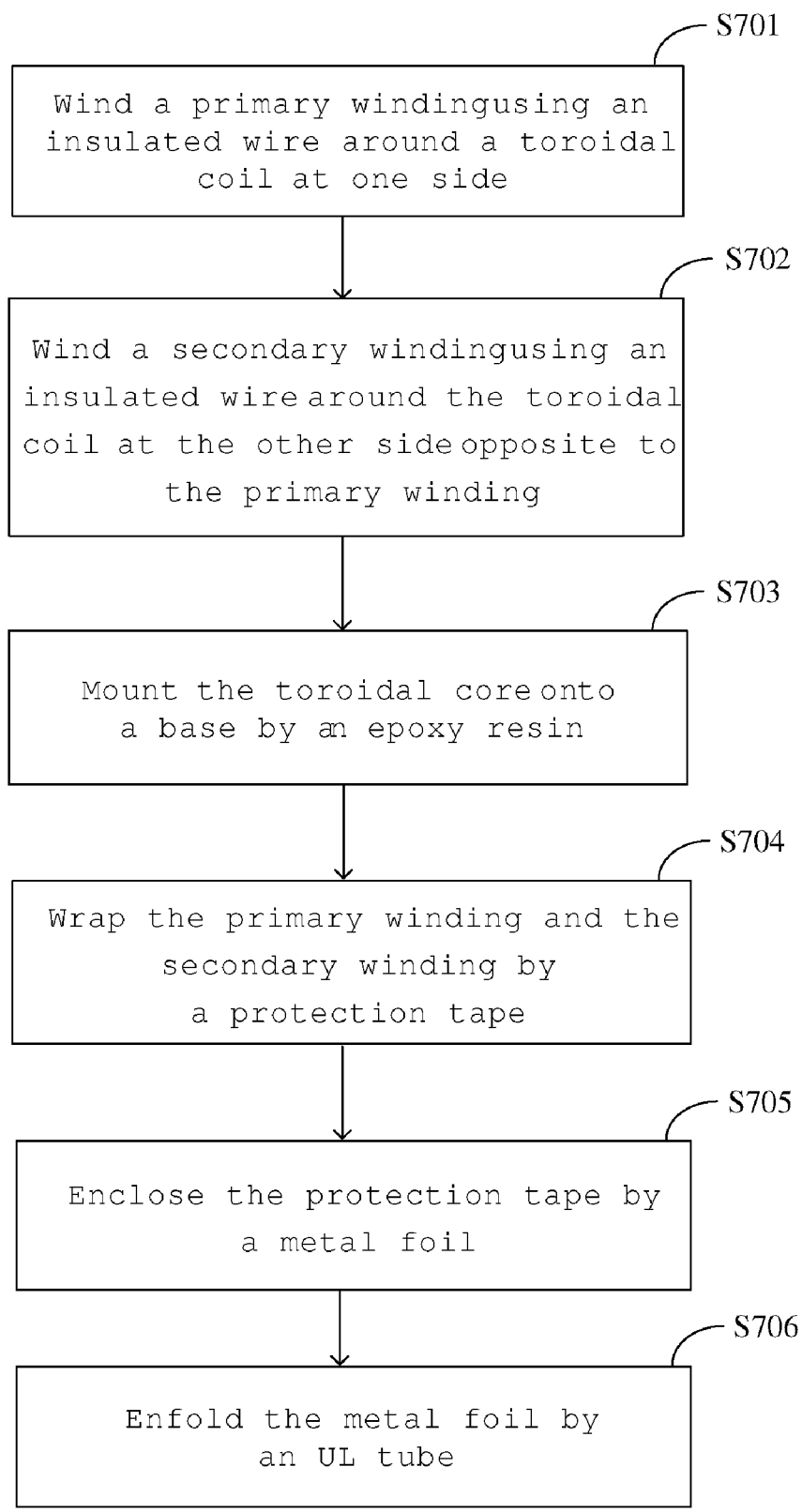
FIG. 7 illustrates a flowchart depicting a transformer shielding method in accordance with a preferred embodiment of the present invention.

Please refer to FIG. 7. FIG. 7 illustrates a flowchart depicting a transformer shielding method for generating a shielded transformer apparatus in accordance with a preferred embodiment of the present invention. The transformer shielding method comprises the following steps:

Step S701: wind a primary winding using an insulated wire around a toroidal core at one side;

Step S702: wind a secondary winding using an insulated wire around the toroidal core at the other side opposite to the primary winding;

Step S703: mount the toroidal core onto a base by an epoxy resin;

Step S704: wrap the primary winding and the secondary winding by a protection tape;

Step S705: enclose the protection tape by a metal foil; and

Step S706: enfold the metal foil by an UL tube.

The step S701 may mean to wind a triple-insulation wire to form the primary winding around the toroidal core at one side. The step S702 may mean to wind a triple-insulation wire to form the secondary winding around the toroidal core at the other side opposite to the primary winding. The step S702 may further mean to wind another secondary winding using an insulated wire around the toroidal core at the other side opposite to the primary winding and the secondary windings may be stranded together. The step S704 may mean to wrap the primary winding and the secondary winding by a polyethylene tape. The step S704 may further mean to glue the bottom edge of the protection tape to the base by another epoxy resin. The step S705 may mean to enclose the protection tape by a copper foil, an aluminum foil, or a tin foil. The step S705 may further mean to bend-over the bottom edge of the metal foil outward external to the toroidal core for forming an U-shaped structure at the bottom edge and leave a gap of about 1 mm between the bottom edge of the metal foil and the base. The step S705 may further mean to glue the bottom edge of the metal foil to the base by another epoxy resin. The step S706 may further mean to glue the bottom edge of the UL tube to the base by another epoxy resin.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A transformer apparatus comprising:
    a toroidal core;
    a primary winding, wound around the toroidal core at one side;
    a secondary winding, wound around the toroidal core at the other side opposite to the primary winding;
    a protection tape wrapping around the primary winding and the secondary winding;
    a metal foil enclosing the protection tape; and
    an Underwriters Laboratories (UL) tube enfolding the metal foil, wherein the UL tube is an isolation tube used for preventing an electrical shock.

2. The transformer apparatus of claim 1, further comprising a base, wherein the toroidal core is mounted onto the base by an epoxy resin.

3. The transformer apparatus of claim 1, wherein the protection tape is a polyethylene tape.

4. The transformer apparatus of claim 1, wherein the metal foil is a copper foil, an aluminum foil, or a tin foil.

5. The transformer apparatus of claim 1, wherein the wire of the primary winding is a triple-insulation wire, oleoreslnous enameled wire, a synthetic enameled wire, a polyurethane enameled wire, a polyester enameled wire, a polyester-imide enameled wire, a nylon coated polyurethane enameled wire, or a tinnable polyester enameled wire.

6. The transformer apparatus of claim 1, wherein the wire of the secondary winding is a triple-insulation wire, oleoreslnous enameled wire, a synthetic enameled wire, a polyurethane enameled wire, a polyester enameled wire, a polyester-imide enameled wire, a nylon coated polyurethane enameled wire, or a tinnable polyester enameled wire.

7. A transformer apparatus comprising:
    a toroidal core;
    a primary winding, wound around the toroidal core at one side;
    a plurality of secondary windings, wound around the toroidal core at the other side opposite to the primary winding;
    a protection tape wrapping around the primary winding and the secondary winding;
    a metal foil enclosing the protection tape; and
    an Underwriters Laboratories (UL) tube enfolding the metal foil, wherein the UL tube is an isolation tube used for preventing an electrical shock.

8. The transformer apparatus of claim 7, further comprising a base, wherein the toroidal core is mounted onto the base by an epoxy resin.

9. The transformer apparatus of claim 7, wherein the plurality of secondary windings are stranded together.

10. The transformer apparatus of claim 7, wherein the protection tape is a polyethylene tape.

11. The transformer apparatus of claim 7, wherein the metal foil is a copper foil, an aluminum foil, or a tin foil.

12. The transformer apparatus of claim 7, wherein the wire of the primary winding is a triple-insulation wire, oleoreslnous enameled wire, a synthetic enameled wire, a polyurethane enameled wire, a polyester enameled wire, a polyester-imide enameled wire, a nylon coated polyurethane enameled wire, or a tinnable polyester enameled wire.

13. The transformer apparatus of claim 7, wherein the wire of the plurality of secondary winding are triple-insulation wires, oleoreslnous enameled wires, synthetic enameled wires, polyurethane enameled wires, polyester enameled wires, polyester-imide enameled wires, nylon coated polyurethane enameled wires, or tinnable polyester enameled wires.

14. A transformer shielding method for generating a shielded transformer apparatus, comprising:
    winding a primary winding using an insulated wire around a toroidal core at one side;
    winding a secondary winding using an insulated wire around the toroidal core at the other side opposite to the primary winding;
    mounting the toroidal core onto a base by an epoxy resin;
    wrapping the primary winding and the secondary winding by a protection tape;
    enclosing the protection tape by a metal foil; and
    enfolding the metal foil by an Underwriters Laboratories (UL) tube, wherein the UL tube is an isolation tube used for preventing an electrical shock.

15. The transformer shielding method of claim 14, further comprising winding another secondary winding using an insulated wire around the toroidal core at the other side opposite to the primary winding.

16. The transformer shielding method of claim 15, wherein the secondary windings are stranded together.

17. The transformer shielding method of claim 14, wherein wrapping the primary winding and the secondary winding by a protection tape means wrapping the primary winding and the secondary winding by a polyethylene tape.

18. The transformer shielding method of claim 14, wherein enclosing the protection tape by a metal foil means enclosing the protection tape by a cooper foil, an aluminum foil, or a tin foil.

19. The transformer shielding method of claim 14, wherein winding a secondary winding using an insulated wire around the toroidal core at the other side opposite to the primary winding means winding a triple-insulation wire to form the secondary winding around the toroidal core at the other side opposite to the primary winding.

* * * * *